(12) United States Patent
Wang et al.

(10) Patent No.: US 10,804,162 B2
(45) Date of Patent: Oct. 13, 2020

(54) DUAL CHANNEL GATE ALL AROUND TRANSISTOR DEVICE AND FABRICATION METHODS THEREOF

(71) Applicant: Taiwan Semiconductor Manufacturing Co., Ltd., Hsin-Chu (TW)

(72) Inventors: Chih-Hao Wang, Hsinchu County (TW); Jui-Chien Huang, Hsinchu (TW); Chun-Hsiung Lin, Hsinchu County (TW); Kuo-Cheng Chiang, Hsinchu County (TW); Chih-Chao Chou, Hsinchu (TW); Pei-Hsun Wang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/366,946

(22) Filed: Mar. 27, 2019

(65) Prior Publication Data
US 2020/0105617 A1     Apr. 2, 2020

Related U.S. Application Data

(60) Provisional application No. 62/737,269, filed on Sep. 27, 2018.

(51) Int. Cl.
*H01L 21/8238*     (2006.01)
*H01L 29/06*     (2006.01)
(Continued)

(52) U.S. Cl.
CPC ......... *H01L 21/823821* (2013.01); *H01L 21/02532* (2013.01); *H01L 21/30604* (2013.01);
(Continued)

(58) Field of Classification Search
CPC ....... H01L 21/823821; H01L 21/02532; H01L 27/0924; H01L 29/0673
(Continued)

(56) References Cited

U.S. PATENT DOCUMENTS 8,796,666 B1    8/2014 Huang et al.
8,815,712 B2    8/2014 Wan et al.
(Continued)

*Primary Examiner* — Igwe U Anya
(74) *Attorney, Agent, or Firm* — Haynes and Boone, LLP

(57) ABSTRACT

A method that includes forming first semiconductor layers and second semiconductor layers disposed over a substrate, wherein the first and second semiconductor layers have different material compositions, are alternatingly disposed, and extend over first and second regions of the substrate; patterning the first and the second semiconductor layers to form a first fin in the first region and a second fin in the second region; removing the first semiconductor layers from the first and second fins such that a first portion of the patterned second semiconductor layers becomes first suspended nanostructures in the first fin and that a second portion of the patterned second semiconductor layers becomes second suspended nanostructures in the second fin; forming third semiconductor layers on the second suspended nanostructures in the second fin; and performing an anneal process to drive materials contained in the third semiconductor layers into corresponding second suspended nanostructures in the second fin.

20 Claims, 11 Drawing Sheets

(51) Int. Cl.
  *H01L 21/02* (2006.01)
  *H01L 21/324* (2006.01)
  *H01L 29/423* (2006.01)
  *H01L 27/092* (2006.01)
  *H01L 29/08* (2006.01)
  *H01L 29/10* (2006.01)
  *H01L 21/306* (2006.01)
  *H01L 21/311* (2006.01)
  *H01L 21/027* (2006.01)
  *H01L 21/762* (2006.01)
  *H01L 29/66* (2006.01)

(52) U.S. Cl.
  CPC .... *H01L 21/324* (2013.01); *H01L 21/823807* (2013.01); *H01L 21/823828* (2013.01); *H01L 27/0924* (2013.01); *H01L 29/0673* (2013.01); *H01L 29/0847* (2013.01); *H01L 29/1037* (2013.01); *H01L 29/42392* (2013.01); *H01L 21/0274* (2013.01); *H01L 21/31116* (2013.01); *H01L 21/76224* (2013.01); *H01L 21/823864* (2013.01); *H01L 21/823878* (2013.01); *H01L 29/6653* (2013.01); *H01L 29/66545* (2013.01)

(58) Field of Classification Search
  USPC .......................................................... 257/351
  See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,508,833 B1* | 11/2016 | Leobandung | H01L 29/66795 |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,805,988 B1* | 10/2017 | Bentley | H01L 21/82380 |
| 10,141,403 B1* | 11/2018 | Cheng | H01L 29/0603 |
| 10,332,999 B1* | 6/2019 | Cheng | H01L 27/0886 |
| 2013/0285116 A1 | 10/2013 | Lochtefeld et al. | |
| 2015/0303303 A1* | 10/2015 | Lauer | H01L 29/0669 257/347 |
| 2016/0071956 A1* | 3/2016 | Balakrishnan | H01L 29/161 257/401 |
| 2017/0092646 A1* | 3/2017 | Chen | H01L 29/66795 |
| 2018/0090494 A1* | 3/2018 | Chao | H01L 21/324 |
| 2019/0015479 A1* | 1/2019 | Barrandon | A61K 38/18 |
| 2019/0296127 A1* | 9/2019 | Cheng | B82Y 10/00 |
| 2020/0044045 A1* | 2/2020 | Wang | H01L 29/1054 |

* cited by examiner

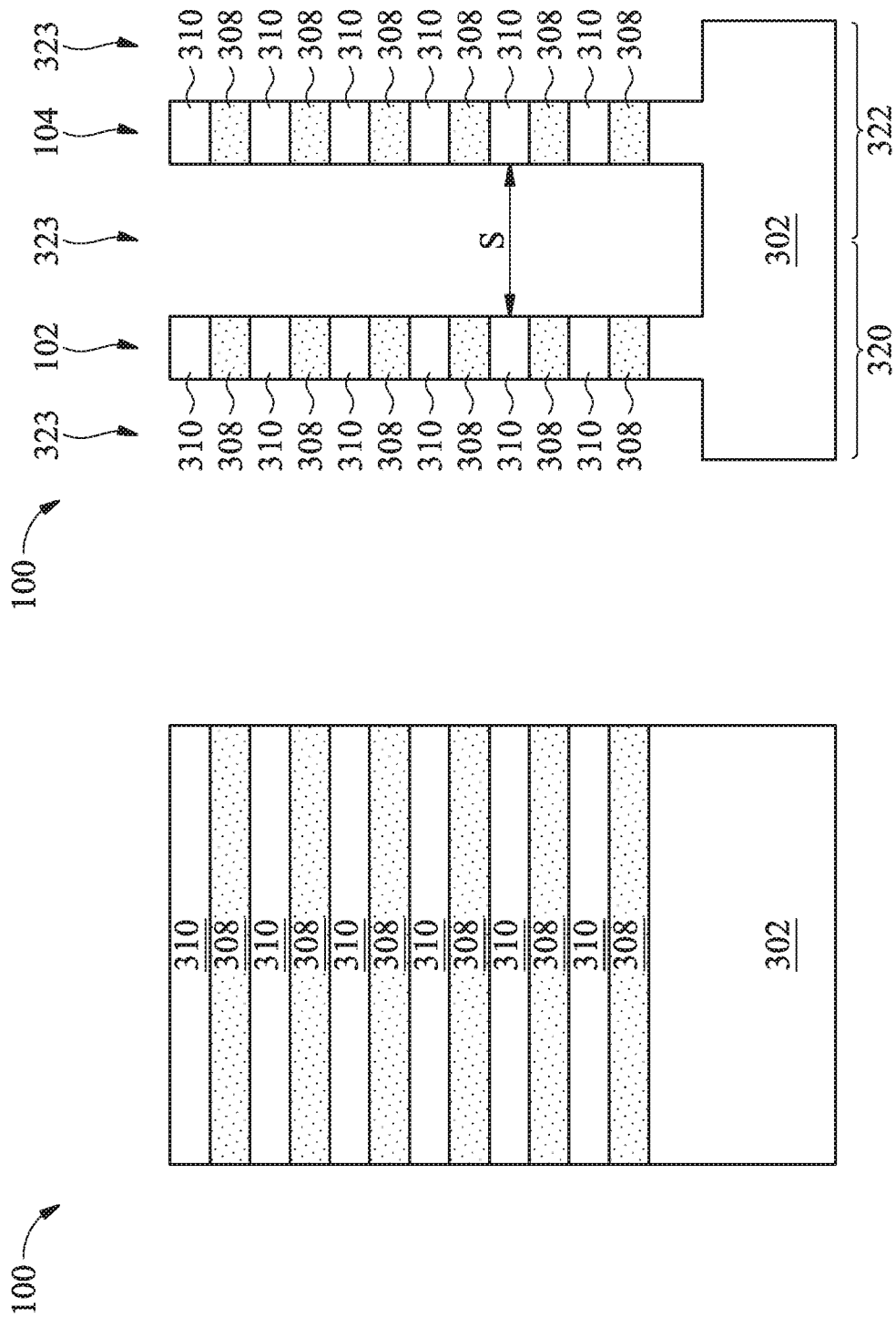

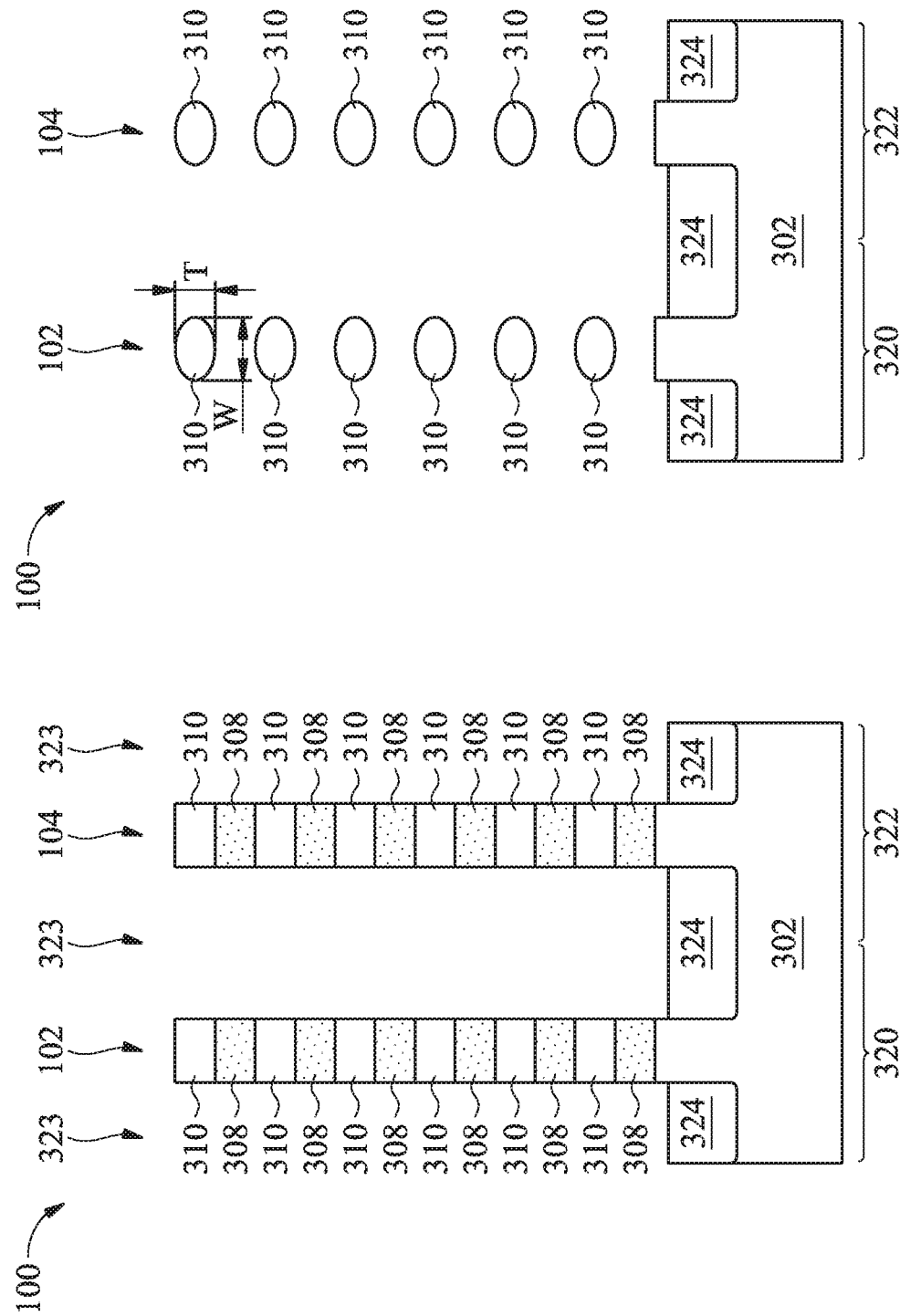

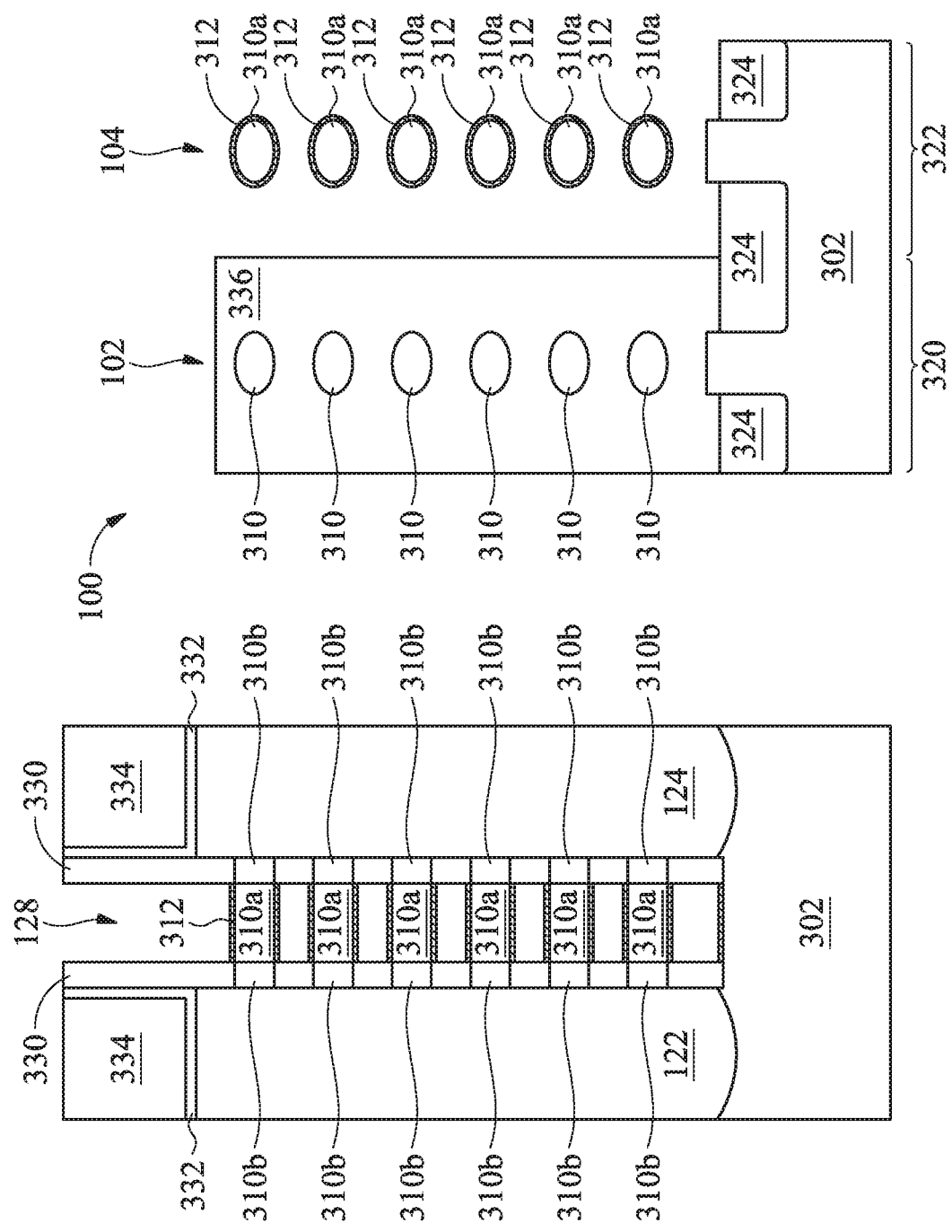

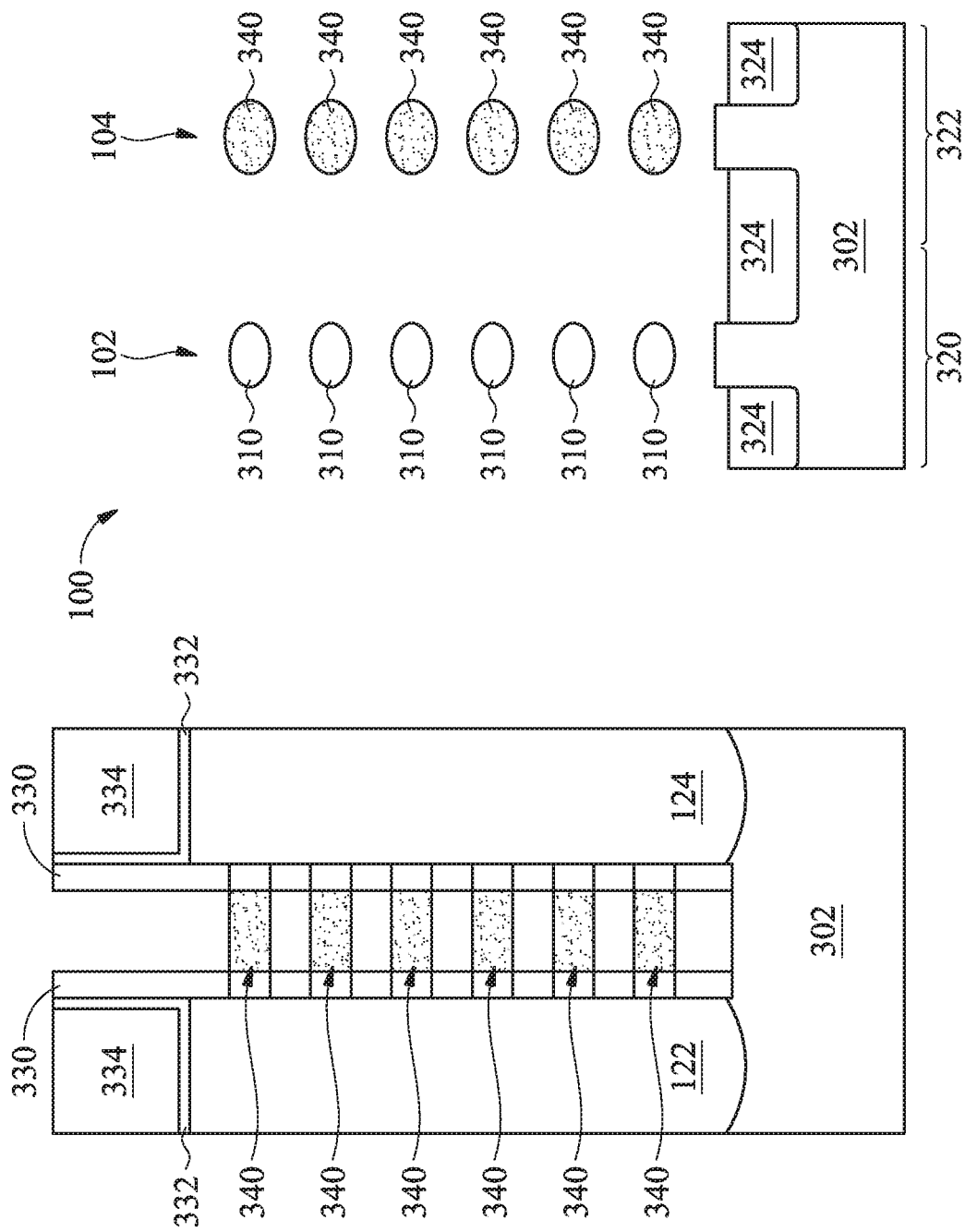

DUAL CHANNEL GATE ALL AROUND TRANSISTOR DEVICE AND FABRICATION METHODS THEREOF

PRIORITY

This application claims priority to U.S. Provisional Patent Application Ser. No. 62/737,269 filed Sep. 27, 2018, and entitled "Dual Channel Gate All Around Transistor Device and Fabrication Methods Thereof," the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced by increasing gate-channel coupling as an effort to improve gate control, reduce off-state current, and reduce short-channel effects (SCEs). One such multi-gate device is gate-all-around (GAA) transistor, whose gate structure wraps around its horizontal channel region providing access to the channel region on all four sides. GAA transistors are compatible with conventional complementary metal-oxide-semiconductor (CMOS) processes, allowing them to be aggressively scaled down while maintaining gate control and mitigating SCEs. However, fabrication of GAA transistors can be challenging as device sizes shrink. For example, current methods—which use separate epitaxial growth and separate patterning of stacked semiconductor layers to realize GAA transistors that have n-type and p-type dual channels—are not satisfactory in all respects, especially when the device pitch is small, such as 40 nanometers (nm) or smaller.

BRIEF DESCRIPTION OF THE DRAWINGS

Aspects of the present disclosure are best understood from the following detailed description when read with the accompanying figures. It is emphasized that, according to the standard practice in the industry, various features are not drawn to scale. In fact, the dimensions of the various features may be arbitrarily increased or reduced for clarity of discussion.

FIGS. 3, 4, 5, 6, 7, 8A, 8B, 9A, 9B, 10A, 10B, 11A, 11B, 12A, and 12B are cross-sectional views of a semiconductor device, at various fabrication stages, constructed according to the method in FIG. 2, according to some embodiments.

DETAILED DESCRIPTION

Figure 1A:
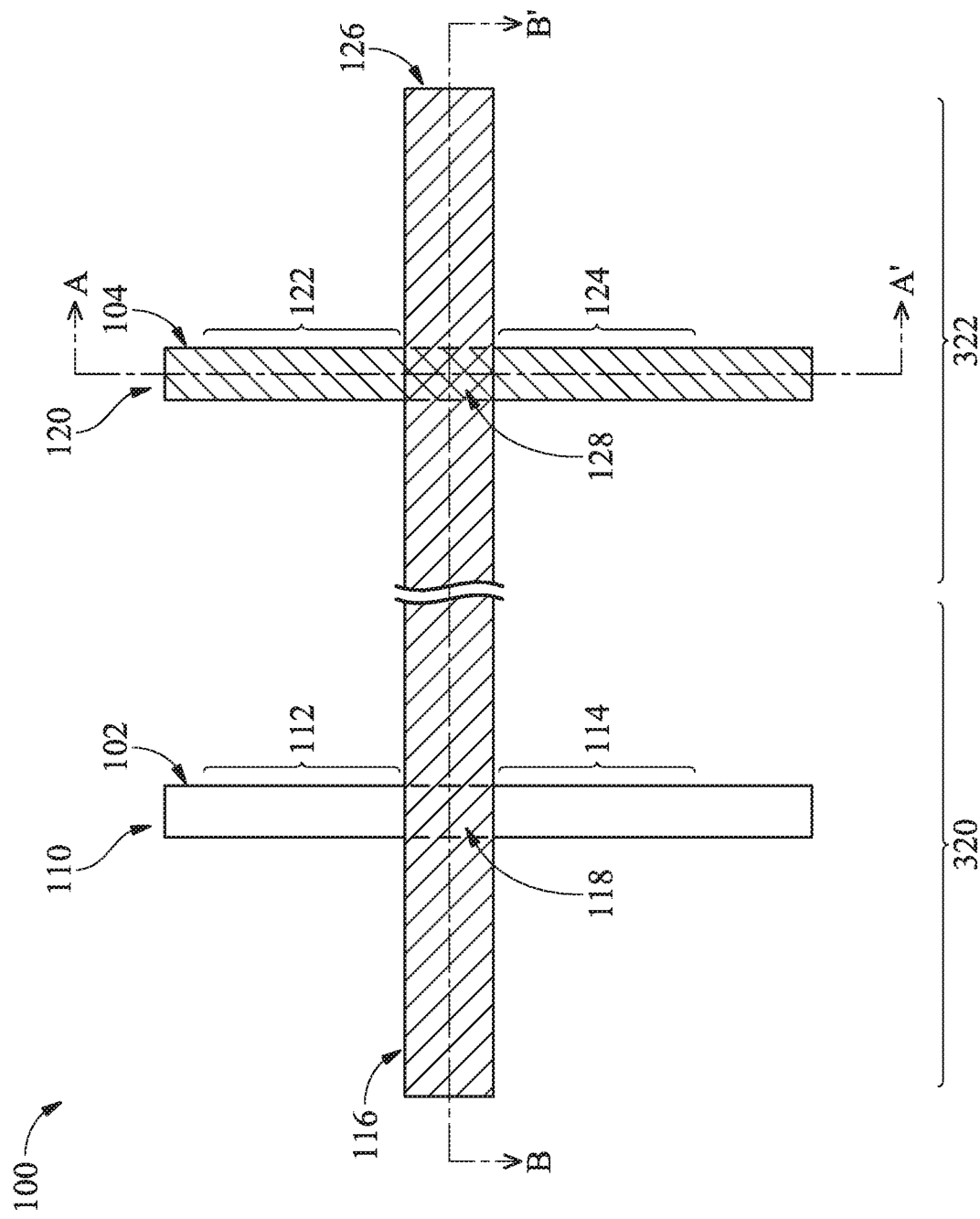
FIGS. 1A and 1B are top and perspective views, respectively, of a semiconductor structure formed according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +1-10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to dual channel gate all around transistor device and fabrication methods thereof.

Presented herein are embodiments of a type of multi-gate transistor referred to as a gate-all-around (GAA) device. A GAA device includes any device that has its gate structure, or portion thereof, formed on four sides of a channel region (e.g., surrounding a portion of a channel region). GAA devices may be used to realize n-type and p-type transistors, often called dual channel transistors, which have vertically stacked n-type channels and p-type channels located on two close fins. GAA dual channel transistors are useful in many integrated circuits (ICs), but some methods of fabrication suffer from various problems. For instance, some methods require separate epitaxial growth and separate patterning of stacked semiconductor layers to realize GAA dual channel transistors. However, such an approach often increases the difficulty of processes (e.g., difficult to use an etchant to remove n-type semiconductor layers and to use another etchant to remove p-type semiconductor layers in the same device) and leads to defects.

The present disclosure addresses the above problems by providing improved methods of forming dual channel GAA field effect transistors (FETs) on multiple fins. According to some embodiments, after growing a stack of alternating first semiconductor layers (e.g., silicon) and second semiconductor layers (e.g., silicon germanium), a method directly patterns the stack to create first and second fins, and then removes the second semiconductor layers to create suspended nanostructures (e.g., nanowires or nanosheets) on both fins. The method avoids various steps such as blocking and etching the first stack, growth of a second stack of n-type and p-type semiconductor layers that alternate differently from the first stack, and removing the n-type semiconductor layers (while retaining p-type layers) from the second stack. Instead, to construct a p-type FinFET on the second fin, a method converts the suspended p-type nanostructures of the second fin to p-type nanostructures by growing thin p-type semiconductor layers (e.g., silicon germanium) that wrap around the suspended p-type nanostructures and then performing an anneal process to drive germanium into the suspended p-type nanostructures. In an example, germanium atoms are driven from a silicon germanium layer into an n-type channel made of silicon. The driven-in germanium forms distinctive distribution within the channel (e.g., distributed in the middle section of the channel but not in end sections of the channel). As a result, dual channel GAA FETs can be achieved with a simplified fabrication process.

It should be understood at the outset that the channel region of a GAA device may include nanowire channels, bar-shaped channels, and/or other suitable channel configurations. In some embodiments, the channel region of a GAA device has multiple horizontal nanowires, nanosheets, and/or nanobars vertically spaced, making the GAA device a stacked horizontal GAA device. The GAA devices presented herein include p-type metal-oxide-semiconductor GAA devices or n-type metal-oxide-semiconductor GAA devices. Further, the GAA devices have one or more channels (e.g., nanowires) associated with a single, contiguous gate structure, or multiple gate structures. One of ordinary skill may recognize other examples of semiconductor devices that may benefit from aspects of the present disclosure.

Figure 1B:
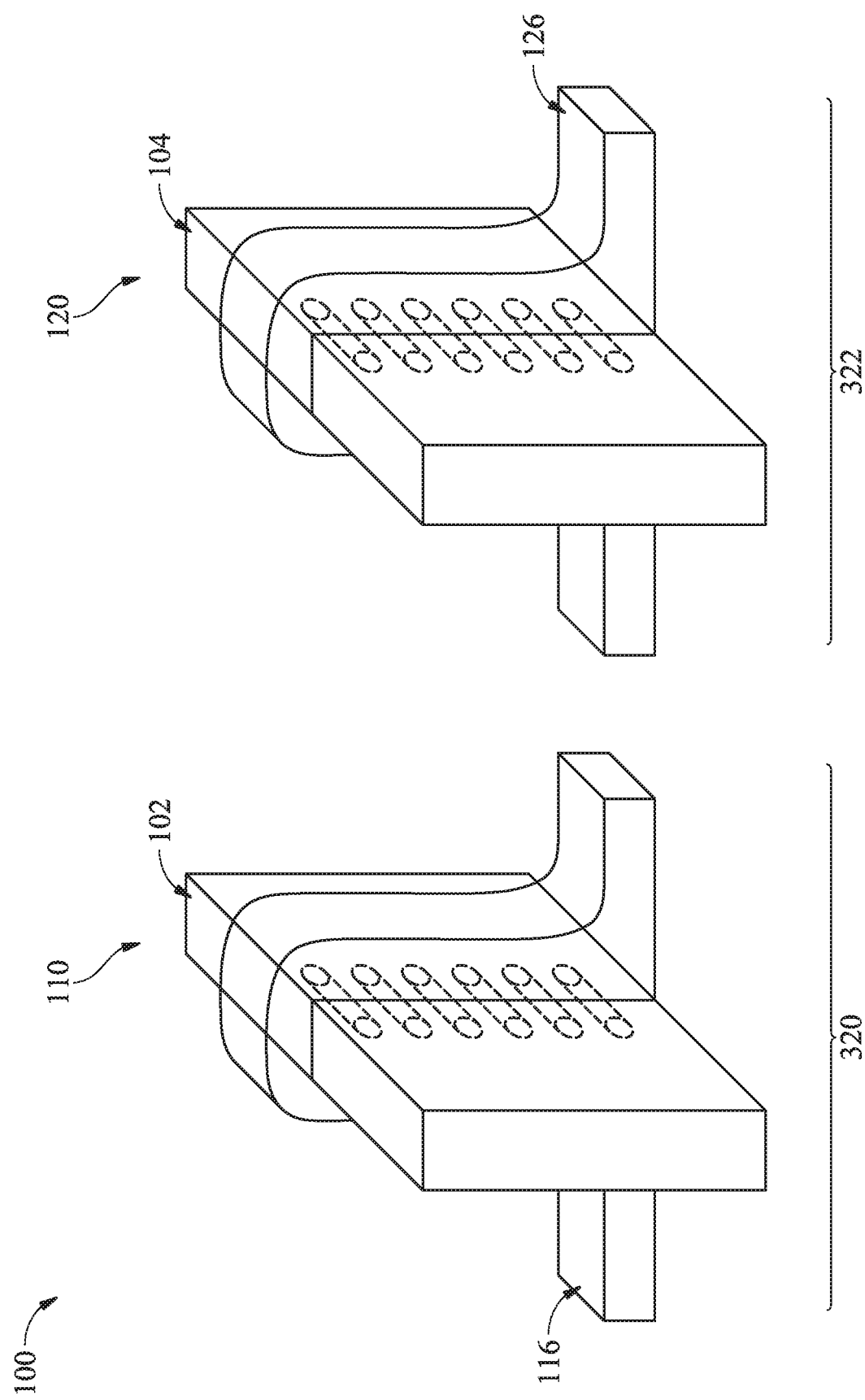

FIGS. 1A and 1B are top and perspective views, respectively, of a semiconductor structure 100 that is formed using embodiments disclosed herein. As illustrated in FIGS. 1A and 1B, the semiconductor structure 100 includes two fins 102 and 104, and an example n-type FET 110 and an example p-type FET 120 are formed on the fins 102 and 104, respectively. Specifically, the n-type FET 110 includes source/drain (S/D) regions 112 and 114 as well as a gate stack 116 interposed between the S/D regions 112 and 114. Similarly, the p-type FET 120 includes S/D regions 122 and 124, and a gate stack 126 interposed between the S/D regions 122 and 124. One or more FETs may be formed on each fin feature. The channel region for each FET, which underlies the gate, is the portion of the corresponding fin interposed between the source and drain regions. In the present embodiment, the n-type FET 110 has a first channel region 118 in the fin 102, and the p-type FET 120 has a second channel region 128 in the fin 104. As shown in FIG. 1A, the channel regions 118 and 128 each comprise nanowire or bar-shaped channels for current conduction, which are wrapped around by the gate stack 126. For the n-type FET 110, current carriers (electrons) flow through the channel region 118 along stacked silicon nanowire or bar-shaped channels (e.g., Si layers), which are considered n-type channels herein. For the p-type FET 120, current carriers (holes) flow through the channel region 128 along silicon germanium nanowire or bar-shaped channels (e.g., $Si_{1-y}Ge_y$ layers), which are considered p-type channels herein. By providing the semiconductor structure 100 having n-type FETs and p-type FETs with respective channel material compositions, the carrier mobility for both are enhanced and device performance is improved.

Figure 2:
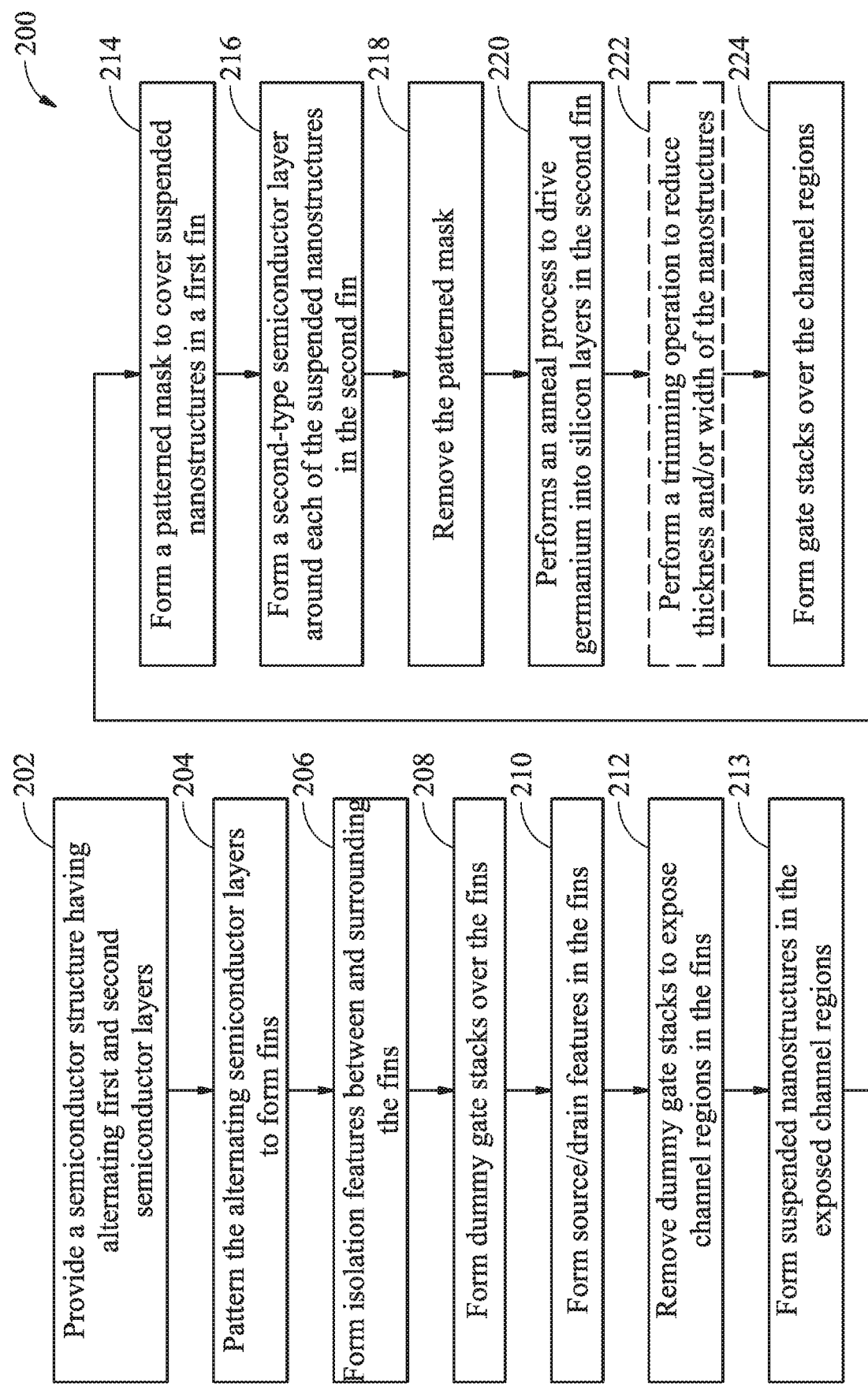
FIG. 2 is a flowchart of a method of forming a semiconductor device according to various aspects of the present disclosure.

FIG. 2 is a flowchart of a method 200 of forming the semiconductor device structure 100, according to various aspects of the present disclosure. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. Some embodiments of method 200 are described below in conjunction with FIGS. 1 and 3-12B and the semiconductor structure 100. FIGS. 8A, 9A, 10A, and 11A are X-cut cross-sectional views of the semiconductor structure 100 (taken along the line A-A' in FIG. 1A) at intermediate operations of the method 200, and FIGS. 3-7, 8B, 9B, 10B, and 11B are Y-cut cross-sectional views of the semiconductor structure 100 (taken along the line B-B' in FIG. 1A) at intermediate operations of the method 200. In FinFET devices, fins extend in a first direction called an X-cut direction, and metal gates extend in a second direction called a Y-cut direction. Thus, the Y-cut cross-sectional views run in parallel with a length direction of the metal gates and perpendicular to a length direction of the fins.

At operation 202, the method 200 (FIG. 2) provides a starting semiconductor structure 100. In an embodiment, the semiconductor structure 100 includes a substrate 302 and a stack of alternatingly disposed semiconductor layers 308 and 310 (FIG. 3). The semiconductor structure 100 is provided for illustration purposes and does not necessarily limit the embodiments of the present disclosure to any number of devices, any number of regions, or any configuration of structures or regions. Furthermore, the semiconductor structures as shown in FIGS. 3-12B are intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 3, the substrate 302 may be a semiconductor substrate such as a silicon substrate. In some embodiments, the substrate 302 includes various layers, including conductive or insulating layers formed on a semiconductor substrate. The substrate 302 may include various doping configurations. For example, different doping profiles (e.g., n wells, p wells) may be formed on the substrate 302 in regions designed for different device types (e.g., n-type field effect transistors (NFET), p-type field effect transistors (PFET)). In some embodiments, the substrate 302 includes other semiconductors such as germanium, silicon carbide (SiC), silicon germanium (SiGe), or diamond. Alternatively, the substrate 302 includes a compound semiconductor and/or an alloy semiconductor. Further, the substrate 302 may optionally include an epitaxial layer, may be strained for performance enhancement, may include a silicon-on-insulator structure, and/or have other suitable enhancement features.

Still referring to FIG. 3, the semiconductor structure 100 includes a stack of semiconductor layers 308 and 310 in an interleaving or alternating fashion (e.g., a semiconductor layer 310 disposed over a semiconductor layer 308, then another semiconductor layer 308 disposed over the semiconductor layer 310, and so on). In some embodiments, the semiconductor layers 308 and 310 are alternatingly disposed in a vertical direction, forming a semiconductor stack. In various embodiments, the stack includes any number of alternately disposed semiconductor layers 308 and 310. In some embodiments, the semiconductor layers 308 and 310 have different thicknesses. Further, the semiconductor layers 308 may have different thicknesses from one layer to another layer, and the semiconductor layers 310 may have different thicknesses from one layer to another layer. In some embodiments, the thickness of each of the semiconductor layers 308 and 310 ranges from several nanometers to tens of nanometers. In an embodiment, each semiconductor layer 308 has a thickness ranging from about 5 nm to about 10 nm, and each semiconductor layer 310 has a thickness ranging from about 5 nm to about 10 nm. Note that, although FIG. 2 illustrates a semiconductor layer 308 as the bottom layer of the stack, a semiconductor layer 310 may be the bottom layer as well. The first layer of the stack may be thicker than other semiconductor layers 308 and 310.

The two types of semiconductor layers 308 and 310 have different compositions. In various embodiments, the semiconductor layers 308 have compositions that provide for different oxidation rates and/or different etch selectivity from the semiconductor layers 310. In an embodiment, the semiconductor layers 308 include silicon germanium ($Si_{1-x}Ge_x$), while the semiconductor layers 310 include silicon (Si). In an embodiment, each semiconductor layer 310 is silicon undoped or substantially dopant-free (i.e., having an extrinsic dopant concentration from about 0 $cm^{-3}$ to about $1 \times 10^{17}$ $cm^{-3}$), where no intentional doping is performed when forming the semiconductor layer 310 (e.g., of silicon). Alternatively, each semiconductor layer 310 is intentionally doped. In an example, the semiconductor layer 310 is made of silicon doped with either a p-type dopant such as boron (B), aluminum (Al), indium (In), and gallium (Ga), or an n-type dopant such as phosphorus (P), arsenic (As), antimony (Sb). In some embodiments, each semiconductor layer 308 is $Si_{1-x}Ge_x$ that includes less than 50% (x<0.5) Ge in molar ratio. For example, Ge comprises about 15% to about 35% of the semiconductor layer 308 of $Si_{1-x}Ge_x$ in molar ratio. Further, the semiconductor layers 308 may include different compositions among them, and the semiconductor layers 310 may include different compositions among them.

In various embodiments, either of the semiconductor layers 308 and 310 includes other materials such as a compound semiconductor (e.g., silicon carbide, gallium arsenide, gallium phosphide, indium phosphide, indium arsenide, and/or indium antimonide), or an alloy semiconductor (e.g., GaAsP, AlInAs, AlGaAs, InGaAs, GaInP, and/or GaInAsP), or combinations thereof. The materials of the semiconductor layers 308 and 310 may be chosen based on providing differing oxidation rates and/or etch selectivity. The semiconductor layers 308 and 310 may be doped or undoped, as discussed above.

In some embodiments, the semiconductor layers 308 and 310 are epitaxially grown layer-by-layer from a top surface of the substrate 302. In an example, each of the semiconductor layers 308 and 310 are grown by a molecular beam epitaxy (MBE) process, a chemical vapor deposition (CVD) process such as a metal organic CVD (MOCVD) process, and/or other suitable epitaxial growth processes. During the epitaxial growth, the crystalline structure of the substrate 302 extends upwardly, resulting in the semiconductor layers 308 and 310 having the same crystal orientation with the substrate 302.

At operation 204, the method 200 (FIG. 2) patterns the alternating semiconductor layers 308 and 310 to form one or more fins extending from the substrate 302. Referring to the example of FIG. 4, the semiconductor structure 100 includes a fin 102 in a first region 320 and a fin 104 in a second region 322. The fins 102 and 104 each include a stack of the semiconductor layers 308 and 310. Although two fins are illustrated for illustration, any suitable number of fins may be formed. The two fins 102 and 104 are spaced by a distance annotated as spacing S. In some embodiments, the spacing S is in a range from about 40 nm to about 100 nm. In furtherance of some embodiments, the spacing S is in a range from about 15 nm to about 40 nm, for tight device integration. In an embodiment, the first region 320 is a region of the substrate 302 defined for one or more n-type FETs and the second region 322 is a region of the substrate 302 defined for one or more p-type FETs. Note that the semiconductor structure 100 may alternatively have a p-type FET form in the region 320 and an n-type FET to form in the region 322.

The operation 204 includes a variety of processes such as photolithography and etching. In an embodiment, the operation 204 first forms a masking element over the semiconductor structure 100 through a photolithography process. The photolithography process may include forming a photoresist (or resist) over the semiconductor structure 100, exposing the resist to a pattern that defines various geometrical shapes, performing post-exposure bake processes, and developing the resist to form the masking element. Subsequently, the operation 204 etches the semiconductor layers 308 and 310 in the regions 320 and 322 through the masking element to form trenches 323 therein. The etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In an example, a wet etching process includes etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants. After etching, the remaining portions of the semiconductor layers 308 and 310 become the fins 102 and 104, defining the trenches 323 between and surrounding the fins 102 and 104. The etching process may further recess into the substrate 302. In some embodiments, the etching process is designed to over-etch into the substrate 302 to ensure that the substrate 302 is exposed throughout the trenches 323.

In an embodiment, the fins 102 and 104 are formed simultaneously using the same pattering steps (instead of being formed sequentially one after another using separate patterning steps). For example, the same photolithography and etching processes are used to form the fins 102 and 104, on which n-type and p-type dual channel GAA transistors may then be formed. Such a simple patterning approach provides advantages over other methods that use separate epitaxial growth and separate patterning of stacked semiconductor materials to realize dual channel use separate epitaxial growth and separate patterning of stacked semiconductor materials to realize GAA transistors.

At operation 206, the method 200 (FIG. 2) forms isolation features 324 between and surrounding the fins 102 and 104. Referring to FIG. 5, the isolation features 324 is formed of silicon oxide, silicon nitride, silicon oxynitride, fluoride-doped silicate glass, a low-k dielectric material, and/or other suitable insulating material. In some embodiments, the isolation features 324 are shallow trench isolation (STI) features. The operation 206 includes a variety of processes such as deposition and etching. In some embodiments, the operation 206 of the method 200 deposits a dielectric material, such as silicon oxide, into the trenches 323. The dielectric material is formed by chemical vapor deposition (CVD), plasma enhanced CVD (PECVD), physical vapor deposition (PVD), thermal oxidation, or other techniques. In some embodiments, a CMP process is performed to planarize a top surface of the semiconductor structure 100. Thereafter, the dielectric material is recessed by selective etching to form the isolation features 324, which isolates various portions of the substrate 302 and/or epitaxial stacks 308/310. The selective etching may include wet etching and/or dry etching to selectively etch back the isolation features 324.

The method 200 then proceeds to forming FETs on the fins 102 and 104. In an example, the method 200 forms the n-type FET 110 on the fin 102 within the first region 320 and the p-type FET 120 on the fin 104 within the second region 322. Forming the FETs includes various procedures and operations, which are described next.

At operation 208, the method 200 forms dummy gate stacks over the fins 102 and 104, respectively. In an embodiment, the dummy gate stacks will be removed in a later gate-replacement process. The dummy gate stacks engage the fins 102 and 104 at the channel regions 118 and 128. The dummy gate stack includes one or more material layers. In the present embodiment, the dummy gate stacks include a polysilicon (or poly) layer. In an embodiment, the dummy gate stacks further include an interfacial layer (e.g., silicon oxide) underneath the poly layer. The poly layer is formed by suitable deposition processes such as low-pressure chemical vapor deposition (LPCVD) and PECVD. In an embodiment, the material layers of the dummy gate stack are first deposited as blanket layers, and then patterned with one or more photolithography and etching processes to form the dummy gate stacks.

Gate spacers (e.g., gate spacers 330 shown in FIG. 8A) are formed on sidewalls on the dummy gate stacks after the dummy gate stacks are patterned. The gate spacer includes one or more dielectric materials such as silicon nitride, silicon oxide, silicon carbide, silicon oxycarbide (SiOC), silicon oxycarbon nitride (SiOCN), other suitable low-k dielectric materials, or combinations thereof. In some embodiments, the gate spacer is formed by depositing a spacer layer blanketing the semiconductor structure 100 with suitable methods, such as chemical oxidation, thermal oxidation, ALD, or CVD, then etching the spacer layer by an anisotropic etching process to remove portions of the spacer layer from a top surface of the dummy gate stacks and from top and sidewall surfaces of the fins (e.g., fins 102 and 104). Portions of the spacer layer on the sidewall surfaces of the dummy gate stacks substantially remain and become the gate spacer. In an embodiment, the anisotropic etching process is a dry (e.g., plasma) etching process.

At operation 210, the method 200 forms source/drain (S/D) features in the S/D regions 112 and 114 of the n-type FET 110 and the S/D regions 122 and 124 of the p-type FET 120. In an embodiment, forming the S/D features includes epitaxially growing a semiconductor layer by an MBE process, a chemical vapor deposition process, and/or other suitable epitaxial growth processes. In a further embodiment, the S/D features are in-situ or ex-situ doped with an n-type dopant or a p-type dopant. For example, in some embodiments, the S/D features includes silicon-germanium (SiGe) doped with boron for forming S/D features for a p-type FET. In some embodiments, the S/D features include silicon doped with phosphorous for forming S/D features for an n-type FET.

At operation 212, the dummy gate stacks are removed to expose channel regions, such as the channel region 118 of the fin 102 and the channel region 128 of the fin 104. The dummy gate stacks, which include the poly layer and any other layers thereunder, are removed to form respective openings. In an embodiment, removing the dummy gate stack includes one or more etching processes, such as wet etching and/or dry etching.

At operation 213, the method 200 forms suspended nanostructures (nanowire or nanosheet) in the exposed channel regions. The formation of suspended nanostructures includes a selective etching process to selectively remove one semiconductor layer from the respective channel region (or channel and source/drain regions) of the FETs. Referring to the example of FIG. 6, the semiconductor layers 308 (e.g., $Si_{1-x}Ge_x$) are removed from the channel regions of the fins 102 and 810 while the semiconductor layers 310 (e.g., Si) substantially remain as the channels. In other words, in the channel regions 118 and 128, the semiconductor layers 308 (or portions thereof) are removed. As a result, portions of the semiconductor layers 310 in the channel regions 118 and 128 are suspended in the respective openings. Therefore, after operation 213, the semiconductor layers 310 (and layers converted from the semiconductor layers 310) are also called suspended nanostructures in the channel regions 118 and 128.

In an embodiment, the semiconductor layers to be removed are etched by a selective wet etching process while the other semiconductor layers with different composition remain substantially unchanged. In some embodiments, the selective wet etching process includes a hydro fluoride (HF) or $NH_4OH$ etchant. In an embodiment where the semiconductor layers 308 includes SiGe and the semiconductor layers 310 includes Si, the selective removal of the SiGe layers 308 includes a SiGe oxidation process followed by a $SiGeO_x$ removal. In an example, the SiGe oxidation process includes forming and patterning various masking layers such that the oxidation is controlled to the SiGe layers 308. In other embodiments, the SiGe oxidation process is a selective oxidation due to the different compositions of the semiconductor layers 308 and 310. In some examples, the SiGe oxidation process is performed by exposing the semiconductor structure 100 to a wet oxidation process, a dry oxidation process, or a combination thereof. Thereafter, the oxidized semiconductor layers 308, which include $SiGeO_x$, are removed by an etchant such as $NH_4OH$ or diluted HF. The semiconductor layer can be also removed by a selective dry etching process while other semiconductor layers with different composition remain substantially unchanged. In some embodiments, the selective dry etching process includes a hydro fluoride (HF), fluoride ($F_2$), Carbon fluoride ($CF_x$), hydrogen ($H_2$)-based etchant.

In the Y-cut view of FIG. 6, the remaining semiconductor layers 310 are illustrated as having oval shapes (due to partial etching of the semiconductor layers 310), but it is understood that the semiconductor layers 310 may be bar-shaped, or rectangle-shaped (nanosheet), or any other suitable shape in this view. In some embodiments, each remaining layer 310 has a thickness (denoted as T in FIG. 6) of about 3 to about 8 nm, and each remaining layer 310 has a width (denoted as W in FIG. 6) of about 5 to about 30 nm.

To realize n-type and p-type dual channels, the method 200 then proceeds to converting the channel region 128 in the fin 104 from a first type to a second type (e.g., from n-type to p-type, or vice versa). In an example, the method 200 forms a first-type (e.g., n-type) channel region 118 in the fin 102 and a second-type (e.g., p-type) channel region 128 in the fin 104. The conversion of the channel region 128 includes various procedures and operations, such as operations 214, 216, and 218, which are described next.

Figure 7:
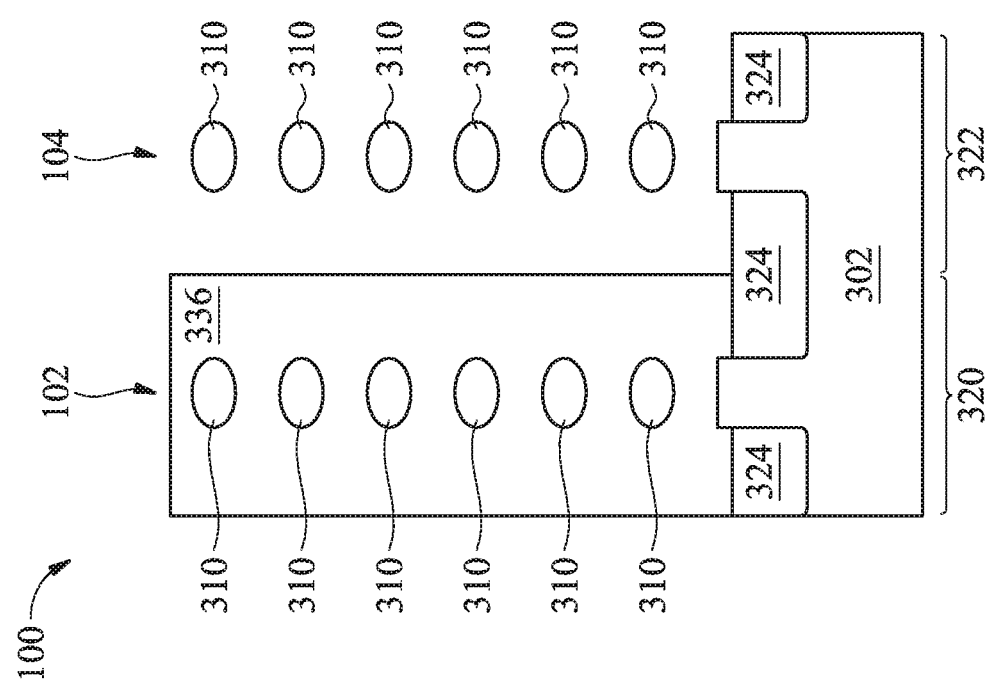

At operation 214, the method 200 (FIG. 2) forms a patterned mask on the top surface of the semiconductor structure 100. As shown in FIG. 7, the patterned mask covers the fin 102 in the first region 320 and includes an opening that exposes the fin 104 in the second region 322 of the semiconductor structure 100. In one embodiment, the patterned mask includes a hard mask 336 (instead of a soft mask such as a patterned resist layer) disposed on the region 320. In some examples, the hard mask 336 includes silicon oxide, silicon nitride, silicon oxynitride, silicon carbide, silicon carbide nitride, silicon carbide oxynitride, other semiconductor material, and/or other dielectric material. In an embodiment, the hard mask 336 has a thickness ranging from about 1 nm to about 40 nm. The hard mask 336 is formed by thermal oxidation, chemical vapor deposition (CVD), atomic layer deposition (ALD), or any other appropriate method. The hard mask 336 is patterned using any suitable methods such as a photolithography process, which may include forming a resist layer on the hard mask 336, exposing the resist by a lithography exposure process, performing a post-exposure bake process, developing the photoresist layer to form the patterned photoresist layer that exposes part of the hard mask 336, patterning the hard mask 336, and finally removing the patterned resist layer. The lithography process may be alternatively replaced by other suitable techniques, such as e-beam writing, ion-beam writing, maskless patterning or molecular printing.

At operation 216, the method 200 forms a semiconductor layer 312 around each of the nanowire or bar-shaped layers 310 located in the fin 104 (but not those in the fin 102). Since semiconductor layers 312 are used to convert the channel region 128 in the fin 104 from a first-type (e.g., n-type) to a second-type (e.g., p-type), the semiconductor layer 312 have different compositions from the semiconductor layers 310. In various embodiments, the semiconductor layers 312 have compositions that provide for different oxidation rates and/or different etch selectivity from the semiconductor layers 310. In an embodiment, the semiconductor layers 312 include silicon germanium ($Si_{1-x}Ge_x$), while the semiconductor layers 310 include silicon (Si). In some embodiments, each layer 312 is $Si_{1-x}Ge_x$ that includes about 10% to about 100% (0.1<x<1) Ge in molar ratio. A sufficient amount of Ge in each layer 312 helps convert the channel region 128 in the fin 104 from a first-type (e.g., n-type) to a second-type (e.g., p-type). For example, Ge may comprise about 60% to about 80% of the layer 312 of $Si_{1-x}Ge_x$ in molar ratio. Such a range of Ge, combined with subsequent processing steps, effectively converts the channel region 128 from the first-type to the second-type. Further, the semiconductor layers 312 may include different compositions among them.

In some embodiments, the semiconductor layers 312 are epitaxially grown from the surfaces of the semiconductor layers 310. For example, each semiconductor layer 312 is grown by an MBE process, a CVD process such as a MOCVD process, and/or other suitable epitaxial growth processes. The epitaxial growth approach allows materials in the semiconductor layer 312 to form crystalline lattices that are consistent with those of the semiconductor layers 310. In some embodiments, each semiconductor layer 312 is a conformal layer that has a substantially uniform thickness. As shown in FIGS. 8A and 8B, each semiconductor layer 312 has a thickness of about 2 to about 5 nm. In some embodiments, a thickness ratio between a semiconductor layer 310 and its surrounding semiconductor layer 312 is about 2:1 to about 4:1. In other words, the semiconductor layer 312 is thinner than its corresponding semiconductor layer 310. Such a thickness ratio provides the suitable amount of germanium needed to convert the semiconductor layers 310 from n-type to p-type.

As shown in FIG. 8A, each semiconductor layer 310 includes a middle section 310a and two end sections 310b, where the middle section 310a is suspended in space (and to be wrapped around by the gate stack 126 in subsequent steps), and the end sections 310b are engaged (e.g., surrounded or wrapped around) by the gate spacers 330. In an embodiment, since only middle sections 310a are exposed, the semiconductor layers 312 are epitaxially grown only in the middle sections 310a, and not in the end sections 310b, of the suspended nanostructures. In other words, the semiconductor layers 312 are only formed at the gate contact region and stop at the gate spacers 330 (i.e., not extending horizontally into the gate spacers 330 or portions of the semiconductor layers 310 surrounded by the gate spacers 330).

Note that FIG. 8A shows other features that have been previously formed, including S/D regions 122 and 124, gate spacers 330, a contact etch stop layer (CESL) 332, and an interlayer dielectric (ILD) layer 334. The formation process of the S/D regions 122 and 124 and the gate spacers 330 have been described above. CESL 332 includes silicon nitride, silicon oxide, silicon oxynitride (SiON), and/or other suitable materials. CESL 332 is formed after dummy gate stacks, and CESL 332 is formed by one or more methods including PECVD, ALD, and/or other suitable methods. In some embodiments, ILD layer 334 is formed over CESL 332, and includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. ILD layer 334 is formed by FCVD, PECVD, or other suitable methods. Further, to tailor characteristics of the p-type transistor on the fin 104, in some embodiments, after operation 216 (FIGS. 8A and 8B), n-type dopants such as phosphorus (P), arsenic (As), antimony (Sb) may also be introduced into the semiconductor layers 312 and corresponding semiconductor layers 310.

Figures 9A, 9B:
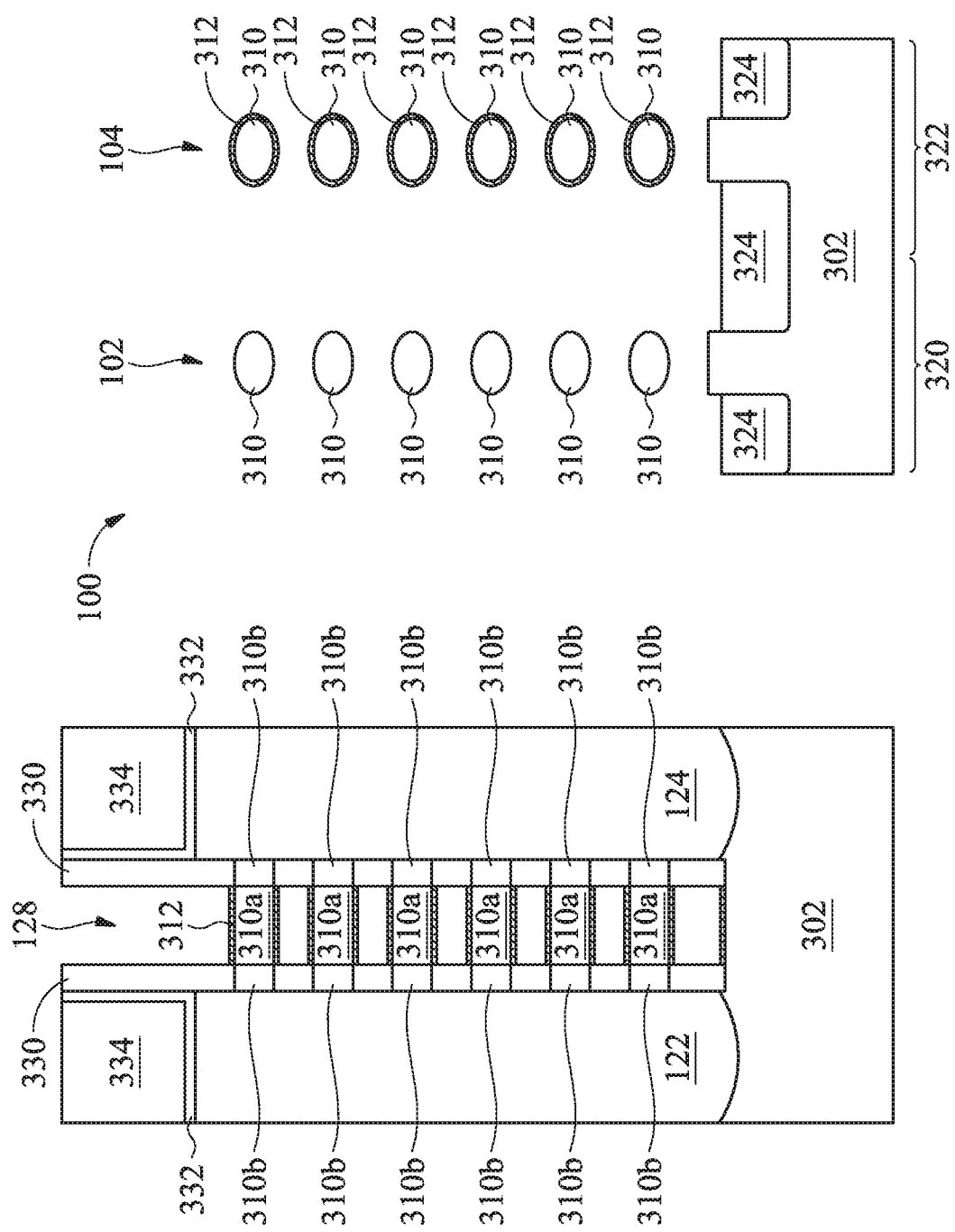

Referring to FIGS. 1, 9A, and 9B, the method 200 at operation 218 removes the patterned mask (e.g., the hard mask 336) from the semiconductor structure 100. Any suitable removal processes including dry etching, wet etching, and/or reactive ion etching (RIE) may be used.

Referring to FIGS. 1, 10A, and 10B, the method 200 at operation 220 performs an anneal process to drive germanium contained in the semiconductor layers 312 into their corresponding semiconductor layers 310. The semiconductor structure 100 is exposed to a gas that contains nitrogen (N), phosphorus, or other suitable elements. To avoid oxidation of the semiconductor layers 312 (e.g., silicon germanium), in some embodiments, the gas contains no oxygen content. The conditions of the anneal process are adjusted to control the profile and characteristics of the resulting channel. In an example, the anneal process is performed at temperatures between about 700 degrees Celsius (V) to about 1200. The anneal process 410 may be performed for a relatively long period such as 10 seconds to 100 seconds (called "soaking") or a relatively short period such as hundreds of milliseconds to a few seconds (e.g., 200 milliseconds to 2 seconds) (called "spiking").

The anneal process causes germanium atoms, and possibly silicon atoms, contained in the semiconductor layers 312 to diffuse or migrate into the corresponding semiconductor layers 310. On the other hand, silicon atoms contained in the semiconductor layers 310 may also diffuse or migrate into the corresponding semiconductor layers 312. As a result of the migration of atoms, the semiconductor layers 312 decrease in germanium content, and the semiconductor layers 310 increase in germanium content. In an embodiment, after the anneal process, each of the semiconductor layers 312 is $Si_{1-x}Ge_x$ that includes more than 0% but equal to or less than about 70% ($0.1<x<0.7$) Ge in molar ratio. Such a range of Ge is a result of diluting the initial concentration of Ge in the layer 312 (e.g. about 10% to about 80%, as described above) and effectively converts the channel region 128 from a first-type (e.g., n-type) to a second-type (e.g., p-type). In an embodiment, the germanium content in the semiconductor layers 310 changes the semiconductor layers 310 from n-type to p-type. Each semiconductor layers 310 and its corresponding semiconductor layer 310 may effectively combine to form a new suspended channel 340, as the material compositions of the semiconductor layers 310 and 312 become the same or similar (e.g., when germanium gets uniformly distributed throughout the semiconductor layers 310 and 312).

Figures 11A, 11B:
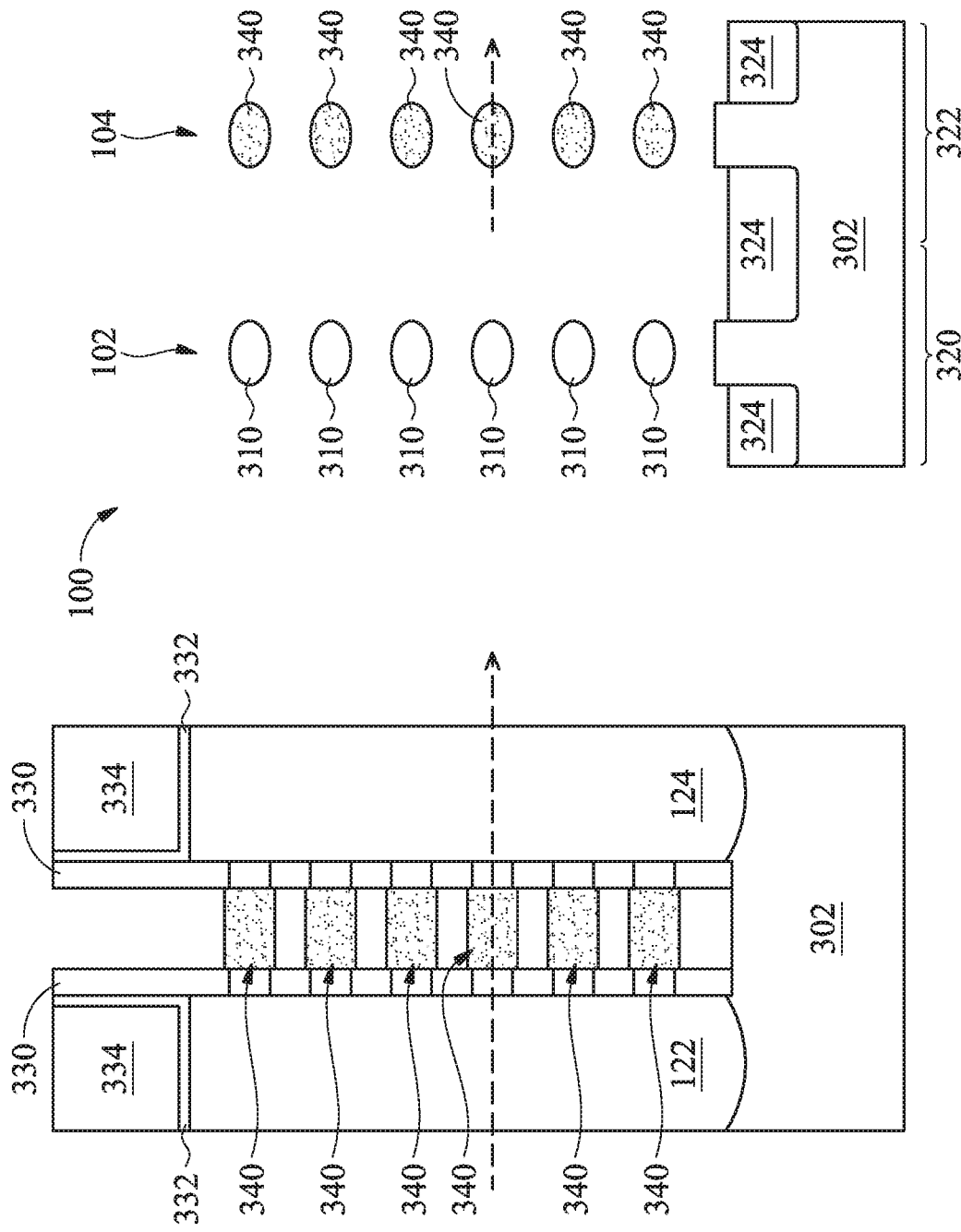

Since the suspended nanostructures 340 are formed as a combination of corresponding semiconductor layers 310 and 312, the suspended nanostructures 340 in the fin 104 may be thicker and wider than the suspended nanostructures 310 in the fin 102. Referring to FIGS. 1, 11A, and 11B, the method 200 at operation 222 optionally performs a trimming operation to reduce the thickness and/or width of the layers. The trimming operation uses any suitable etching process such as dry etching, wet etching, and/or RIE. In an embodiment, the suspended nanostructures 340 in the fin 104 are trimmed to have about the same dimensions (e.g., thickness and/or width) as the suspended nanostructures 310 in the fin 102.

According to some embodiments disclosed herein, the driven-in germanium atoms get distributed in the suspended nanostructures 340 in various ways, which may be tailored by controlling the conditions of the anneal process. As described above and shown in FIG. 8A, when the semiconductor layers 312 were epitaxially grown, they attached to the middle sections 310a of the suspended nanostructures. Thus, during the anneal process, germanium atoms in the semiconductor layers 312 may diffuse mostly into the middle sections 310a (and not the end sections 310b) of corresponding the suspended nanostructures. FIG. 12A illustrates an example concentration profile of germanium in the X-cut direction (along the line taken in FIG. 11A). As shown in FIG. 12A, a concentration of germanium in the middle section of each channel 340 is higher than a concentration of the germanium in the two end sections of the channel 340. Any suitable methods of determining concentration may be used (e.g., by determining an average concentration or median concentration). In an embodiment, the concentration of the germanium in the middle section of each channel 340 is substantially uniform, while the concentration of the germanium in the end sections of each channel 340 takes a gradient profile (e.g., gradually decreasing from the high concentration in the middle section until the concentration becomes zero). Note that, due to the spreading nature of germanium migration in the anneal process, the concentration of germanium may start to decrease at points C and C' shown in FIG. 12A, which may be a few nanometers off from the interface between the middle section and an end section. In some embodiments (for example, when the anneal process has a short duration and/or low temperatures), germanium does not reach far enough under the gate spacers 330 to reach the source region 122 and the drain region 124. Instead, the concentration of germanium drops to zero at the points D and D' shown in FIG. 12A. Thus, at least a portion of the two end sections—which is in direct contact with the gate spacers 330, the source region 122, and the drain region 124—is substantially devoid of germanium. In an embodiment, the entire end sections of the channel 340 are substantially devoid of germanium.

Figure 12B:
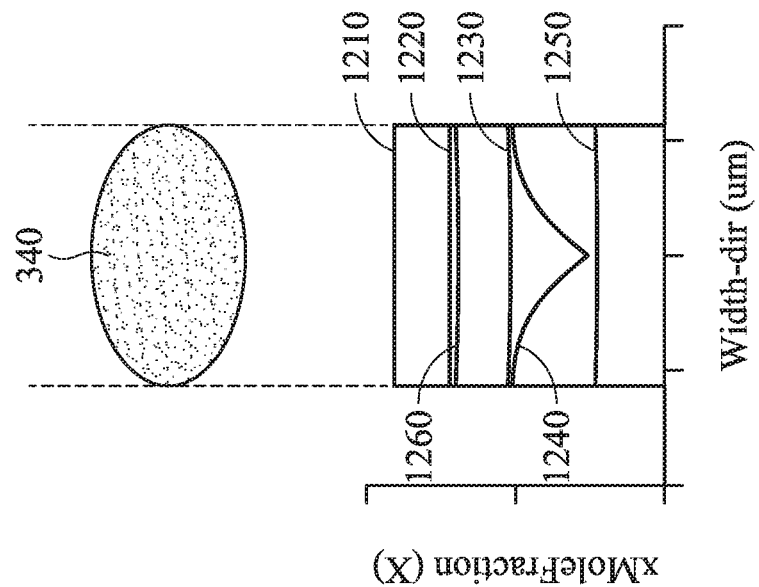
Figure 12A:
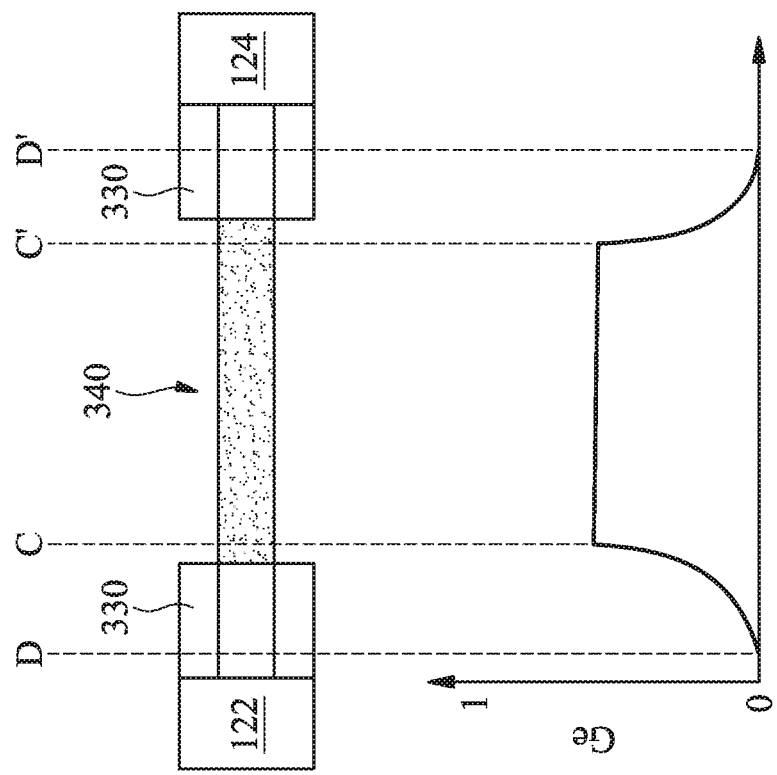

FIG. 12B illustrates an example simulated concentration profile of germanium in the Y-cut direction (along the line taken in FIG. 11B). As shown in FIG. 12B, a concentration of germanium in a core portion of each channel 340 may be equal to or lower than a concentration of germanium in an edge portion of the channel 340. Different concentration profiles may be realized by controlling various parameters such as the thickness of a semiconductor layer 312, the concentration of germanium in the semiconductor layer 312, and/or conditions of its anneal process. For example, a thicker semiconductor layer 312 supplies more germanium atoms, and a longer anneal process (or performed at higher temperatures) drives germanium further into a core of the channel 340, thereby leading to a more uniform concentration of germanium. FIG. 12B illustrates an example of how to control the concentration profile of the semiconductor layer 312.

In FIG. 12B, profiles 1210-1260 represent six different sets of parameters that illustrate how each specific set of parameters leads to a distinctive concentration profile of germanium in a semiconductor layer 312. Specifically, profile 1210 represents the case where the layer 312 is about 4.5 to about 5.5 nm thick, contains about 50% to about 60% of germanium, and is annealed at a spiking temperature of about 1200 to about 1300 Celsius. A uniform germanium concentration of about 34% to 38% is achieved in both the core portion and the edge portion of the channel 340. In profile 1220, the layer 312 is about 2.5 nm to about 3.5 thick, contains about the same concentration of germanium as in profile 1210, and is annealed at a spiking temperature of about 1030 to about 1070 Celsius. A germanium concentration of 26% to about 30% is achieved in the edge portion of the channel 340, and a slightly lower germanium concentration (about 1% lower) is achieved in the core portion of the channel 340. In profile 1230, the layer 312 is about 1.3 to about 1.7 nm thick, contains about the same concentration of germanium as in profile 1210/1220, and is annealed at a temperature of about 1030 to about 1070 Celsius for about 4 to about 6 seconds. A germanium concentration of about 18% to about 22% is achieved in the edge and core portions of the channel 340. In profile 1240, the layer 312 is about 1.3 to about 1.7 nm thick, contains about the same concentration of germanium as in profile 1210/1220/1230, and is annealed at about the same temperature as in profile 1220. The germanium concentration follows a gradient profile that decreases from a maximal concentration of about 18% to about 22% at the edge of the channel 340 to a minimal concentration of about 11% to about 13% at the core of the channel 340. In some embodiments, such a gradient profile is caused by the relatively short duration of the anneal process (e.g., insufficient time for germanium to migrate all the way to the core). In profile 1250, the layer 312 of about 1.3 to about 1.7 nm thick and containing about 23% to about 23% of germanium is annealed at a spiking temperature of about 1150 to about 1250 Celsius. A germanium concentration of about 9% to about 11% is achieved in the edge and core portions of the channel 340. Lastly, profile 1260 represents a reference case where a p-type channel made of SiGe contains about 26% to 30% of germanium in its edge and core portions. As illustrated in FIG. 12B, different distribution profiles of germanium are achieved by controlling one or more parameters including the thickness of a semiconductor layer 312, the concentration of germanium in the semiconductor layer 312, and/or conditions of its anneal process. Each specific set of parameters leads to a distinctive concentration profile of germanium in the layer 312.

In an embodiment, at operation 224 (FIG. 2), the method 200 continues to form the gate stacks 116 and 126 over the channel regions 118 and 128 of the fins 102 and 104, respectively. Referring to the example of FIG. 1A, the gate stacks 116 and 126 fill the openings in the channel regions and wrap around each of the exposed semiconductor layers (e.g., nanowires), such as the semiconductor layers 310 in the channel region 118 and the semiconductor layers 312 in the channel regions 128. The gate stacks 116 and 126 have similar structures but in some embodiments use different metals and/or different thicknesses of layers. In the present embodiment, the gate stacks include a dielectric layer which may include one or multiple layers of dielectric materials on interior surfaces of the opening and directly wrapping over each of the channel semiconductor layers. The dielectric layer includes a dielectric material such as silicon oxide or silicon oxynitride, and is formed by chemical oxidation, thermal oxidation, ALD, CVD, and/or other suitable methods. In some embodiments, the dielectric layer also includes a high-k dielectric layer such as hafnium oxide, zirconium oxide, lanthanum oxide, titanium oxide, yttrium oxide, strontium titanate, other suitable metal-oxides, or combinations thereof; and is formed by ALD and/or other suitable methods. The gate stacks further include a gate metal stack which may include one or multiple layers over the dielectric layer(s), and a metal fill layer over the gate metal stack. In some embodiments, the gate metal stack includes a work function metal layer, which is a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. In some embodiments, the p-type or n-type work function metal layer includes a plurality of layers deposited by CVD, PVD, and/or other suitable process. The metal fill layer includes aluminum, tungsten, cobalt, copper, and/or other suitable materials, and is formed by CVD, PVD, plating, and/or other suitable processes. In some embodiments, the gate stacks wrap around the vertically-stacked horizontally-oriented channel semiconductor layers. Hence, the semiconductor structure 100 is a stacked horizontal gate-all-around (S-HGAA) device. In an embodiment, after the gate stacks are deposited, a CMP process is performed to planarize a top surface of the semiconductor structure 100.

Further processes may be performed to complete the fabrication of the semiconductor structure 100. For example, the method may continue to form contact openings, contact metal, as well as various contacts, vias, wires, and multilayer interconnect features (e.g., metal layers and interlayer dielectrics) over the substrate 302, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure form dual channel GAA FET devices on multiple fins. According to some embodiments, after growing a stack of alternating n-type and p-type semiconductor layers, a method directly patterns the stack to create first and second fins, and then removes the p-type semiconductor layers to create suspended p-type nanostructures on both fins. The method then converts the suspended p-type nanostructures of the second fin to p-type nanostructures by growing thin p-type semiconductor (e.g., germanium or silicon germanium) layers that wrap around the suspended p-type nanostructures and then performing an anneal process to drive germanium atoms into the suspended p-type nanostructures. As a result, dual channel GAA FETs are achieved with a simplified fabrication process. In some embodiments, the channels only have germanium at a gate contact region (not end sections under gate spacers). Further, embodiments of the present disclosure may be integrated into existing CMOS fabrication flow, providing for improved process window.

In one example aspect, the present disclosure provides a method of forming a semiconductor device. The method includes providing a substrate having a plurality of first semiconductor layers and a plurality of second semiconductor layers disposed over the substrate, wherein the first and second semiconductor layers have different material compositions and are alternatingly disposed with respect to each other in a vertical direction, wherein each of the first and second semiconductor layers extends over first and second regions of the substrate; patterning the first semiconductor layers and the second semiconductor layers to form a first fin in the first region and a second fin in the second region; removing the first semiconductor layers from the first and second fins such that a first portion of the patterned second semiconductor layers becomes first suspended nanostructures in the first fin and that a second portion of the patterned second semiconductor layers becomes second suspended nanostructures in the second fin; forming a plurality of third semiconductor layers on the second suspended nanostructures in the second fin; and performing an anneal process to drive materials contained in the third semiconductor layers into corresponding second suspended nanostructures in the second fin.

In another example aspect, the present disclosure provides a method that includes forming a plurality of first suspended layers in a first fin and a plurality of second suspended layers in a second fin, wherein the first and second suspended layers include a same first semiconductor material; epitaxially growing a plurality of third layers on the second suspended layers in the second fin, wherein the third layers include a second semiconductor material that differs from the first semiconductor material; and driving the second semiconductor material to migrate from the third layers into corresponding second layers in the second fin.

In yet another example aspect, the present disclosure provides a semiconductor structure. The semiconductor structure includes a substrate; a fin disposed on the substrate, the fin comprising a source region, a drain region, and a channel region disposed between the source and drain regions, the channel region comprising a plurality of channels vertically stacked over one another, the channels comprising germanium distributed therein; a gate stack engaging the channel region of the fin; and gate spacers disposed between the gate stack and the source and drain regions of the fin. Each of the channels includes a middle section wrapped around by the gate stack and two end sections engaged by the gate spacers. A concentration of germanium in the middle section of each channel is higher than a concentration of germanium in the two end sections of the channel.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a substrate having a plurality of first semiconductor layers and a plurality of second semiconductor layers disposed over the substrate, wherein the first and second semiconductor layers have different material compositions and are alternatingly disposed with respect to each other in a vertical direction, wherein each of the first and second semiconductor layers extends over first and second regions of the substrate;
    patterning the first semiconductor layers and the second semiconductor layers to form a first fin in the first region and a second fin in the second region;
    removing the first semiconductor layers from the first and second fins such that a first portion of the patterned second semiconductor layers becomes first suspended nanostructures in the first fin and that a second portion of the patterned second semiconductor layers becomes second suspended nanostructures in the second fin;
    forming a plurality of third semiconductor layers on the second suspended nanostructures in the second fin; and
    performing an anneal process to drive materials contained in the third semiconductor layers into corresponding second suspended nanostructures in the second fin.

2. The method of claim 1, wherein the forming of the third semiconductor layers includes epitaxially growing each of the third semiconductor layers to surround a corresponding second suspended nanostructure in the second fin, and wherein the third semiconductor layers have different material compositions than the second semiconductor layers.

3. The method of claim 1, wherein during the anneal process the materials contained in the third semiconductor layers are distributed uniformly in middle sections of the second suspended nanostructures and are distributed following a gradient profile in end sections of the second suspended nanostructures.

4. The method of claim 1, wherein the first suspended nanostructures in the first fin are for use in an n-type transistor, and wherein the second suspended nanostructures in the second fin are for use in a p-type transistor as a result of the materials driven into the second suspended nanostructures.

5. The method of claim 1, wherein the anneal process comprises using a gas that includes nitrogen but not oxygen.

6. The method of claim 1, wherein before the anneal process the third semiconductor layers include between about 10% and 100% of germanium, and wherein after the anneal process the third semiconductor layers include no more than 70% of germanium.

7. The method of claim 1, wherein after the anneal process each third semiconductor layer and its corresponding second semiconductor layer together form a new suspended channel in the second fin, and wherein the method further comprises trimming the new suspended channel in the second fin to have about the same thickness as the first suspended nanostructures in the first fin.

8. The method of claim 1, further comprising:
    forming a first gate stack over the first fin, wherein a portion of the first gate stack wraps around the first suspended nanostructures; and
    forming a second gate stack over the second fin, wherein a portion of the second gate stack wraps around the second suspended nanostructures.

9. A method, comprising:
    forming a plurality of first suspended layers in a first fin and a plurality of second suspended layers in a second fin, wherein the first and second suspended layers include a same first semiconductor material;
    epitaxially growing a plurality of third layers on the second suspended layers in the second fin, wherein the third layers include a second semiconductor material that differs from the first semiconductor material; and
    driving the second semiconductor material to migrate from the third layers into corresponding second layers in the second fin.

10. The method of claim 9, wherein the forming of the first and second suspended layers comprises:
    forming alternating layers of the first semiconductor material and of an additional semiconductor material;
    patterning the alternating layers to form a first fin and a second fin; and
    removing the additional semiconductor material from the patterned alternating layers, thereby forming the first suspended layers in the first fin and the second suspended layers in the second fin.

11. The method of claim 9, wherein the epitaxial growth of the third layers includes epitaxially growing silicon germanium on a surface of silicon.

12. The method of claim 9, wherein the third layers are epitaxially grown such that a thickness ratio between each third layer and the corresponding second suspended layer is no less than 1:4 and no greater than 1:2.

13. The method of claim 9, wherein the second semiconductor material is driven into the second layers in the second fin by an anneal process that uses nitrogen gas.

14. The method of claim 13, wherein after the anneal process each third layer and its corresponding second suspended layer together form a new suspended layer in the second fin, and wherein the method further comprises trimming the new suspended channel in the second fin to have about the same thickness as the first suspended layers in the first fin.

15. A semiconductor structure, comprising:
    a substrate;
    a fin disposed on the substrate, the fin comprising a source region, a drain region, and a channel region disposed between the source and drain regions, the channel region comprising a plurality of channels vertically stacked over one another, the channels comprising germanium distributed therein;
    a gate stack engaging the channel region of the fin; and
    gate spacers disposed between the gate stack and the source and drain regions of the fin, wherein each of the channels includes a middle section wrapped around by the gate stack and two end sections engaged by the gate spacers, wherein a concentration of germanium in the middle section of each channel is higher than a concentration of germanium in the two end sections of the channel.

16. The semiconductor structure of claim 15, wherein the concentration of germanium in the middle section of each channel is substantially uniform.

17. The semiconductor structure of claim 15, wherein at least a portion of the two end sections, which is in direct contact with the gate spacers, the source region, and the drain region, is substantially devoid of germanium.

18. The semiconductor structure of claim 15, wherein the fin is a first fin and the channels are first channels that form part of a p-type transistor, wherein the semiconductor structure further comprises a second fin disposed on the substrate that forms part of an n-type transistor, wherein the second fin comprises a plurality of second channels stacked over one another, and wherein each of the second channels comprises silicon.

19. The semiconductor structure of claim 18, wherein the first channels have a greater thickness or width than the second channels.

20. The semiconductor structure of claim 18, wherein the first and second channels include nanowire channels.

* * * * *